United States Patent
Zarabadi et al.

(10) Patent No.: US 10,788,541 B2
(45) Date of Patent: Sep. 29, 2020

(54) METHOD FOR PINPOINTING A SHORT-CIRCUIT

(71) Applicant: DELPHI TECHNOLOGIES IP LIMITED, St. Michael (BB)

(72) Inventors: Seyed R. Zarabadi, Kokomo, IN (US); Daniel C. Penrod, Russiaville, IN (US); Mark W. Gose, Kokomo, IN (US)

(73) Assignee: DELPHI TECHNOLOGIES IP LIMITED (BB)

( * ) Notice: Subject to any disclaimer, the term of this patent is extended or adjusted under 35 U.S.C. 154(b) by 0 days.

(21) Appl. No.: 16/446,122

(22) Filed: Jun. 19, 2019

(65) Prior Publication Data

US 2019/0302165 A1 Oct. 3, 2019

Related U.S. Application Data

(63) Continuation of application No. 15/444,835, filed on Feb. 28, 2017, now Pat. No. 10,371,736.

(51) Int. Cl.
| | |
|---|---|
| *G01R 31/00* | (2006.01) |
| *G01R 31/02* | (2006.01) |
| *G01R 1/20* | (2006.01) |
| *G01R 17/02* | (2006.01) |
| *G01R 31/50* | (2020.01) |
| *G01R 31/08* | (2020.01) |
| *F02D 41/14* | (2006.01) |
| *F02D 41/22* | (2006.01) |
| *F02D 41/20* | (2006.01) |

(52) U.S. Cl.
CPC ......... *G01R 31/50* (2020.01); *F02D 41/1456* (2013.01); *F02D 41/1495* (2013.01); *F02D 41/222* (2013.01); *G01R 1/203* (2013.01); *G01R 17/02* (2013.01); *G01R 31/08* (2013.01); *F02D 2041/2093* (2013.01); *G01R 31/006* (2013.01); *Y02T 10/40* (2013.01)

(58) Field of Classification Search
CPC ...... G01R 31/00; G01R 31/02; G01R 31/024; G01R 31/025; G01R 31/08; G01R 1/203; G01R 17/02
See application file for complete search history.

(56) References Cited

U.S. PATENT DOCUMENTS

| | | |
|---|---|---|
| 9,128,139 B2 | 9/2015 | Carbonaro et al. |
| 2005/0288847 A1 | 12/2005 | Inoue et al. |
| 2006/0219553 A1 | 10/2006 | Ieda et al. |

(Continued)

FOREIGN PATENT DOCUMENTS

| | | |
|---|---|---|
| CN | 201269862 Y | 7/2009 |
| CN | 100578247 C | 1/2010 |

*Primary Examiner* — Neel D Shah
(74) *Attorney, Agent, or Firm* — Joshua M. Haines (57) ABSTRACT

A method is proved for pinpointing a short-circuit in a wide-range air/fuel sensor having one or more sensor-terminals that include a reference-terminal, a pump-terminal, a return-terminal, and a tag-terminal. The method includes controlling a connection of a source of electric current to the one or more sensor-terminals; determining one or more status-values based on signals present at the sensor-terminals; and determining a sensor-status of the wide-range air/fuel sensor based on the connection of source of electric current and the one or more status-values.

12 Claims, 8 Drawing Sheets

(56) References Cited

U.S. PATENT DOCUMENTS

| | | |
|---|---|---|
| 2008/0077303 A1 | 3/2008 | Zushi et al. |
| 2012/0001641 A1 | 1/2012 | Tsukada et al. |
| 2012/0167656 A1 | 7/2012 | Verdier et al. |
| 2012/0266647 A1 | 10/2012 | Barnikow et al. |
| 2013/0234744 A1 | 9/2013 | Carbonaro et al. |
| 2015/0068278 A1 | 3/2015 | Yazawa et al. |
| 2018/0024093 A1* | 1/2018 | Watanabe .......... G01N 27/4175 205/775 |
| 2018/0179976 A1* | 6/2018 | Nishimoto .......... F02D 41/1495 |

* cited by examiner

| SENSOR-STATUS —30 | FIRST-RESULT —70 | SECOND-RESULT —72 | THIRD-RESULT —74 |
|---|---|---|---|
| SHORT-CIRCUIT ON REFERENCE-TERMINAL | 1 | 0 | 0 |
| SHORT-CIRCUIT ON PUMP-TERMINAL | 0 | 1 | 0 |
| SHORT-CIRCUIT ON TAG-TERMINAL | 0 | 0 | 1 |
| SHORT-CIRCUIT ON RETURN-TERMINAL | 0 | 0 | 0 |
| NO SHORT-CIRCUIT | ALL OTHER POSSIBLE STATES | | |

METHOD FOR PINPOINTING A SHORT-CIRCUIT

CROSS-REFERENCE TO RELATED APPLICATIONS

This application is a continuation application of U.S. patent application Ser. No. 15/444,835, filed on Feb. 28, 2017, the entire disclosure of which is hereby incorporated by reference in its entirety.

TECHNICAL FIELD OF INVENTION

This disclosure generally relates to a method for pinpointing a short-circuit, and more particularly relates to a method for pinpointing a short-circuit for a wide-range air-fuel sensor.

BACKGROUND OF INVENTION

It is desirable to diagnose a short-circuit to a battery and/or a ground of an air-fuel sensor in an automotive application. A wide-range air-fuel sensor typically has several electrical wires that may become short-circuited to the battery or ground. Difficulty in determining which sensor wire is short-circuited may be caused by the internal cell bias voltage from the reference and pump cells, battery and ground voltage fluctuations, and large common-mode signals. Additionally, it is advantageous to be able to pinpoint a short-circuit while the sensor is at operating temperature, of which the prior art is incapable.

SUMMARY OF THE INVENTION

In accordance with one embodiment, a method is provided for pinpointing a short-circuit in a wide-range air/fuel sensor having one or more sensor-terminals that include a reference-terminal, a pump-terminal, a return-terminal, and a tag-terminal. The method includes controlling a connection of a source of electric current to the one or more sensor-terminals; determining one or more status-values based on signals present at the sensor-terminals; and determining a sensor-status of the wide-range air/fuel sensor based on the connection of source of electric current and the one or more status-values.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
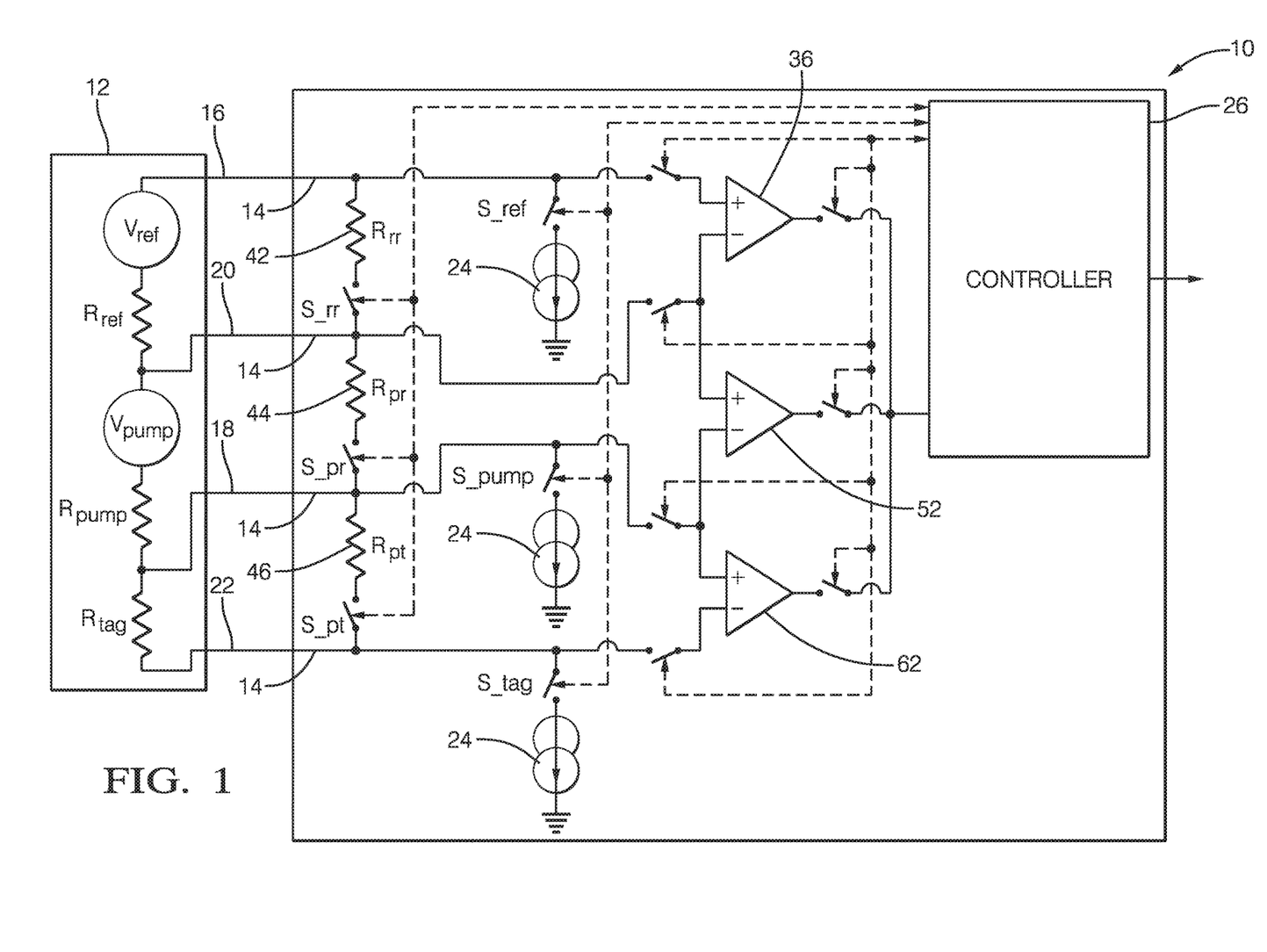
FIG. 1 is an illustration of a short-circuit pinpointing device in accordance with a first embodiment.

FIG. 1 illustrates a non-limiting example of a first embodiment of a short-circuit pinpointing device 10, hereafter referred to as the device 10, that is designed to test a wide-range air/fuel sensor 12 (WRAF-sensor 12) to detect various short-to-ground and short-to-battery conditions. The device 10 includes input-channels 14 for connecting to the WRAF-sensor 12 at a reference-terminal 16, a pump-terminal 18, a return-terminal 20, and a tag-terminal 22. The WRAF-sensor 12 may include an additional ground-terminal (not shown) as will be recognized by those in the art.

The device 10 also includes a current-sink 24 that is selectively connectable to one or more of the WRAF-sensor 12 terminals described above. The current-sink 24 may be any current-sink 24 suitable for use in an automotive application and may produce an electrical current in the range of 400 micro-amps (µA) to 600 µA. While FIG. 1 illustrates multiple current-sinks attached to the WRAF-sensor 12 terminals, it will be recognized by those in the art that a single current-sink 24 may be used with multiple switching-devices attached to the WRAF-sensor 12 terminals.

Figure 2:
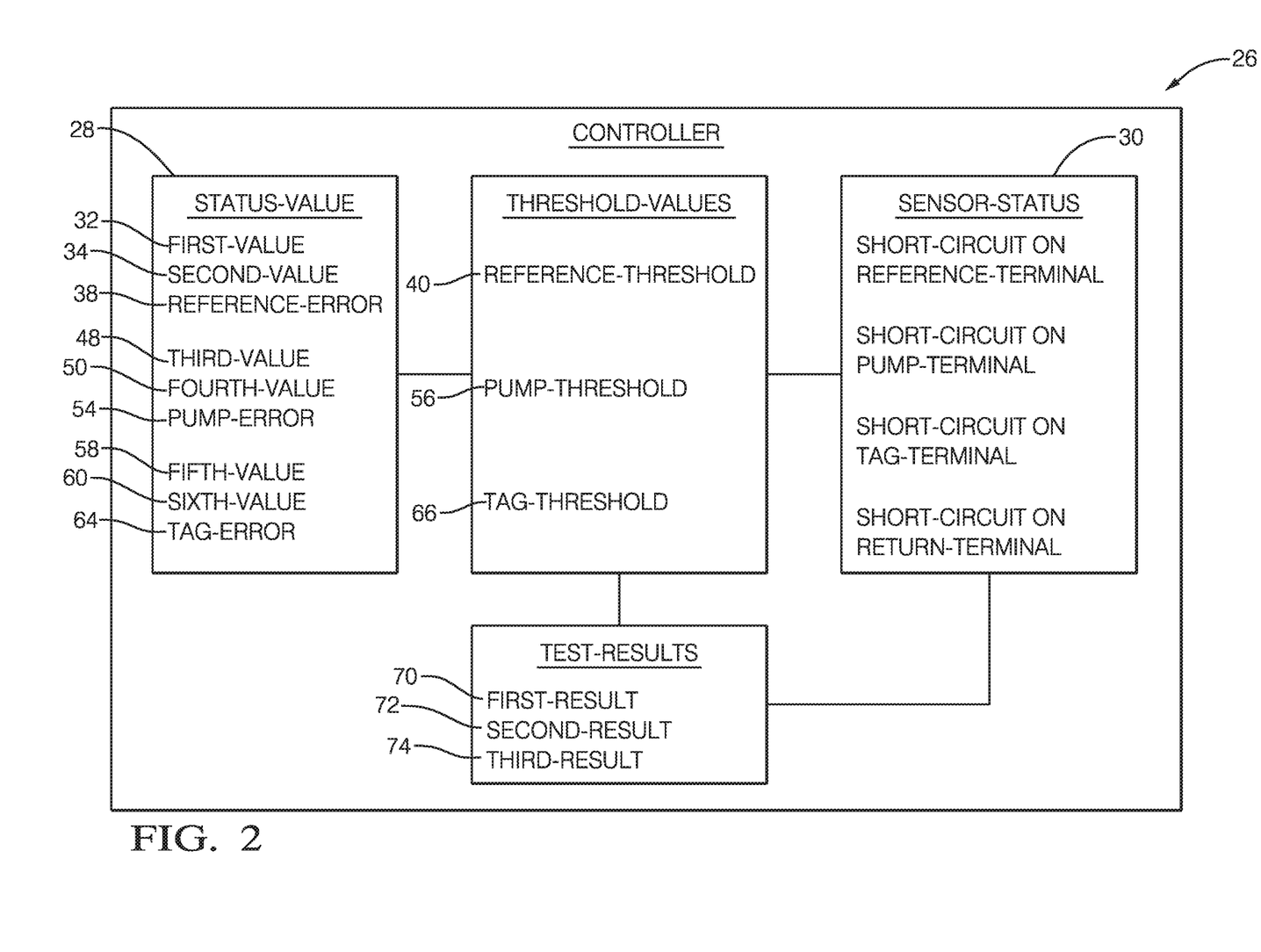
FIG. 2 is an illustration of a controller for the short-circuit pinpointing device of FIG. 1 in accordance with the invention.

The device 10 also includes a controller 26 in communication with the current-sink 24 and the WRAF-sensor 12 terminals. The controller 26 may control the connection of the current-sink 24 to the one or more sensor-terminals to determine one or more status-values 28 (FIG. 2) of the WRAF-sensor 12 based on signals present at the sensor-terminals. The controller 26 may also determine a sensor-status 30 (FIG. 2) of the WRAF-sensor 12 based on the connection of the current-sink 24 and the one or more status-values 28, as will be described in more detail below.

The controller 26 may include a processor (not shown) such as a microprocessor or other control circuitry such as analog and/or digital control circuitry including an application specific integrated circuit (ASIC) for processing data as should be evident to those in the art. The controller 26 may include memory, including non-volatile memory, such as electrically erasable programmable read-only memory (EEPROM) for storing one or more routines, threshold-values, and captured data. The one or more routines may be executed by the processor to perform steps for determining if signals received by the controller 26 indicate the presence of short-circuits as described herein.

The controller 26 may determine a first-value 32 based on a difference between signals at the reference-terminal 16 and the return-terminal 20 while the current-sink 24 is disconnected as indicated by the open switch S_ref (FIG. 1). The controller may then close switch S_ref connecting the current-sink 24 to the reference-terminal 16 and may determine a second-value 34 based on a difference between signals at the reference-terminal 16 and the return-terminal 20. It will be recognized by one skilled in the art that the two switches connecting a first-amplifier 36 to the reference-terminal 16 and the return-terminal 20, and the switch connected to the output of the first-amplifier 36, are closed by the controller 26 in order to determine the first-value 32 and the second-value 34. The controller 26 may then determine a reference-error 38 based on the difference between the second-value 34 and the first-value 32, and may store a first-result 70 as a logical '1' when a reference-threshold 40 is greater than the reference-error 38. The controller may also store the first-result 70 as a logical '0' when the reference-threshold 40 is not greater than the reference-error 38.

The device 10 may also include three test-resistors that are each selectively connectable between two of the sensor-terminals, wherein the controller controls the connection of the test-resistor between the two sensor-terminals, as illustrated in FIG. 1. A first-test-resistor 42 may be connected between the reference-terminal 16 and the return-terminal 20, a second-test-resistor 44 may be connected between the return-terminal 20 and the pump-terminal 18, and a third-test-resistor 46 may be connected between the pump-terminal 18 and the tag-terminal 22 while the first-value 32 and the second-value 34 are determined. The three test-resistors may be any resistor suitable for use in an automotive application and preferably each have a resistance of 1000-ohms.

The controller 26 may also determine a third-value 48 based on a difference between signals at the pump-terminal 18 and the return-terminal 20 while the current-sink 24 is disconnected as indicated by the open switch S_pump. The controller may then close switch S_pump connecting the current-sink 24 to the pump-terminal 18 and may determine a fourth-value 50 based on a difference between signals at the pump-terminal 18 and the return-terminal 20. It will be recognized by one skilled in the art that the two switches connecting a second-amplifier 52 to the return-terminal 20 and the pump-terminal 18, and the switch connected to the output of the second-amplifier 52, are closed by the controller 26 in order to determine the third-value 48 and the fourth-value 50. The controller 26 may then determine a pump-error 54 based on the difference between the fourth-value 50 and the third-value 48, and may store a second-result 72 as a logical '1' when a pump-threshold 56 is greater than the pump-error 54. The controller may also store the second-result 72 as a logical '0' when the pump-threshold 56 is not greater than the pump-error 54.

While the third-value 48 and the fourth-value 50 are determined by the controller 26, the first-test-resistor 42 may not be connected between the reference-terminal 16 and the return-terminal 20, the second-test-resistor 44 may be connected between the return-terminal 20 and the pump-terminal 18, and the third-test-resistor 46 may be connected between the pump-terminal 18 and the tag-terminal 22.

The controller 26 may also determine a fifth-value 58 based on a difference between signals at the tag-terminal 22 and the pump-terminal 18 while the current-sink 24 is disconnected as indicated by the open switch S_tag. The controller 26 may then close switch S_tag connecting the current-sink 24 to the tag-terminal 22 and may determine a sixth-value 60 based on a difference between signals at the tag-terminal 22 and the pump-terminal 18. It will be recognized by one skilled in the art that the two switches connecting a third-amplifier 62 to the pump-terminal 18 and the tag-terminal 22, and the switch connected to the output of the third-amplifier 62, are closed by the controller 26 in order to determine the fifth-value 58 and the sixth-value 60. The controller 26 may then determine a tag-error 64 based on the difference between the sixth-value 60 and the fifth-value 58, and may store a third-result 74 as a logical '1' when a tag-threshold 66 is greater than the tag-error 64. The controller 26 may also store the third-result 74 as a logical '0' when the tag-threshold 66 is not greater than the tag-error 64.

While the fifth-value 58 and the sixth-value 60 are determined by the controller 26, the first-test-resistor 42 may not be connected between the reference-terminal 16 and the return-terminal 20, the second-test-resistor 44 may be connected between the return-terminal 20 and the pump-terminal 18, and the third-test-resistor 46 may be connected between the pump-terminal 18 and the tag-terminal 22.

Figure 3:
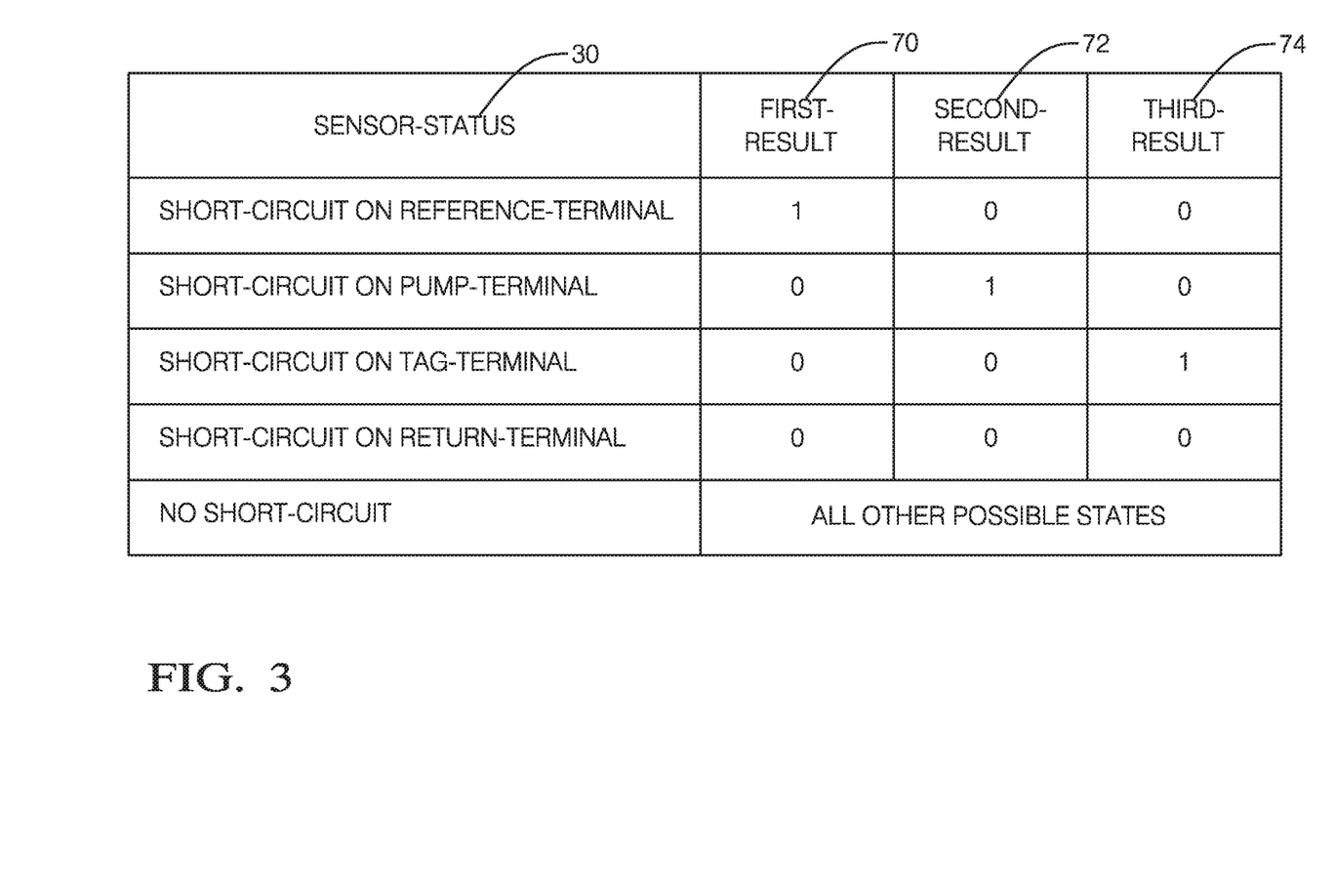
FIG. 3 is a table that summarizes a test-result logic versus a sensor-status in accordance with the invention.

If the stored test-results are such that the first-result 70 is logical '1', the second-result 72 is logical '0', and the third-result 74 is logical '0', then the controller 26 assigns a sensor-status 30 indicative of a short-circuit on the reference-terminal 16. If the stored test-results are such that the first-result 70 is logical '0', the second-result 72 is logical '1', and the third-result 74 is logical '0', then the controller 26 assigns a sensor-status 30 indicative of a short-circuit on the pump-terminal 18. If the stored test-results are such that the first-result 70 is logical '0', the second-result 72 is logical '0', and the third-result 74 is logical '1', then the controller 26 assigns a sensor-status 30 indicative of a short-circuit on the tag-terminal 22. If the stored test-results are such that the first-result 70 is logical '0', the second-result 72 is logical '0', and the third-result 74 is logical '0', then the controller 26 assigns a sensor-status 30 indicative of a short-circuit on the return-terminal 20. FIG. 3 is a table that summarizes test-result logic versus the sensor-status 30 that is performed by the controller 26.

It will be recognized by one skilled in the art that the determination of the status-values 28 described above may be performed by the controller 26 independently and in any order.

The three amplifiers shown in FIG. 1 are for illustration purposes only. One skilled in the art will recognize that the three amplifiers may be replaced by one amplifier by using multiple switching-devices to connect the amplifier to the desired sensor-terminals as determined by the controller 26, as illustrated in FIG. 4.

Figure 4:
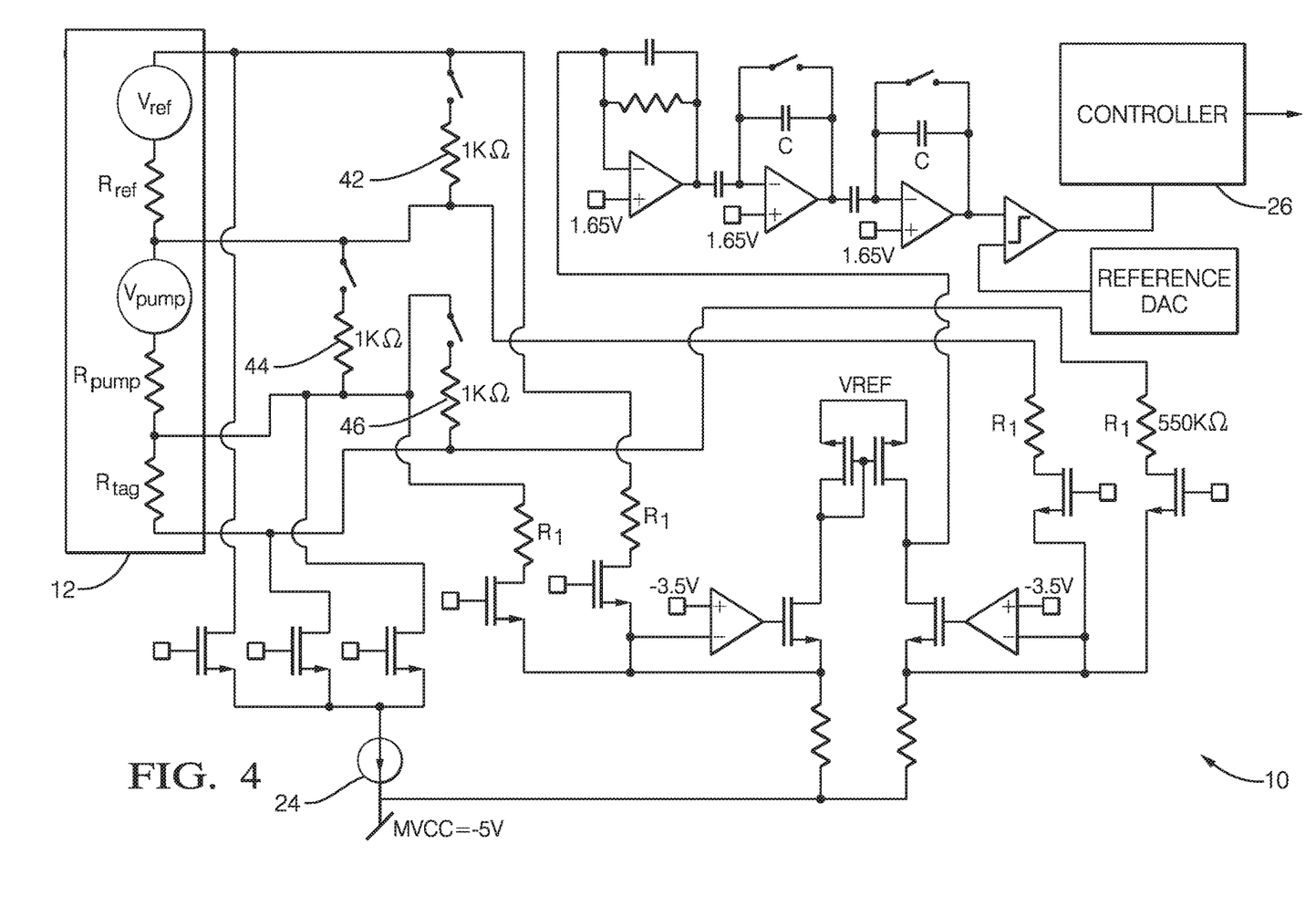
FIG. 4 is an illustration of a short-circuit pinpointing device in accordance with a second embodiment.

FIG. 4 illustrates a non-limiting example of a second embodiment of the device 10 that may be used to pinpoint short-circuits in the WRAF-sensor 12. It will be understood by those in the art that the controller 26 may control the various switches and transistors to perform the tests described herein.

The switches used to connect the current-sink 24, the amplifiers, and the test-resistors may be any switches suitable for use in an automotive application, and may include, but are not limited to, relays, thyristors, and transistors, as will be recognized by one skilled in the art of electronics.

Figure 5:
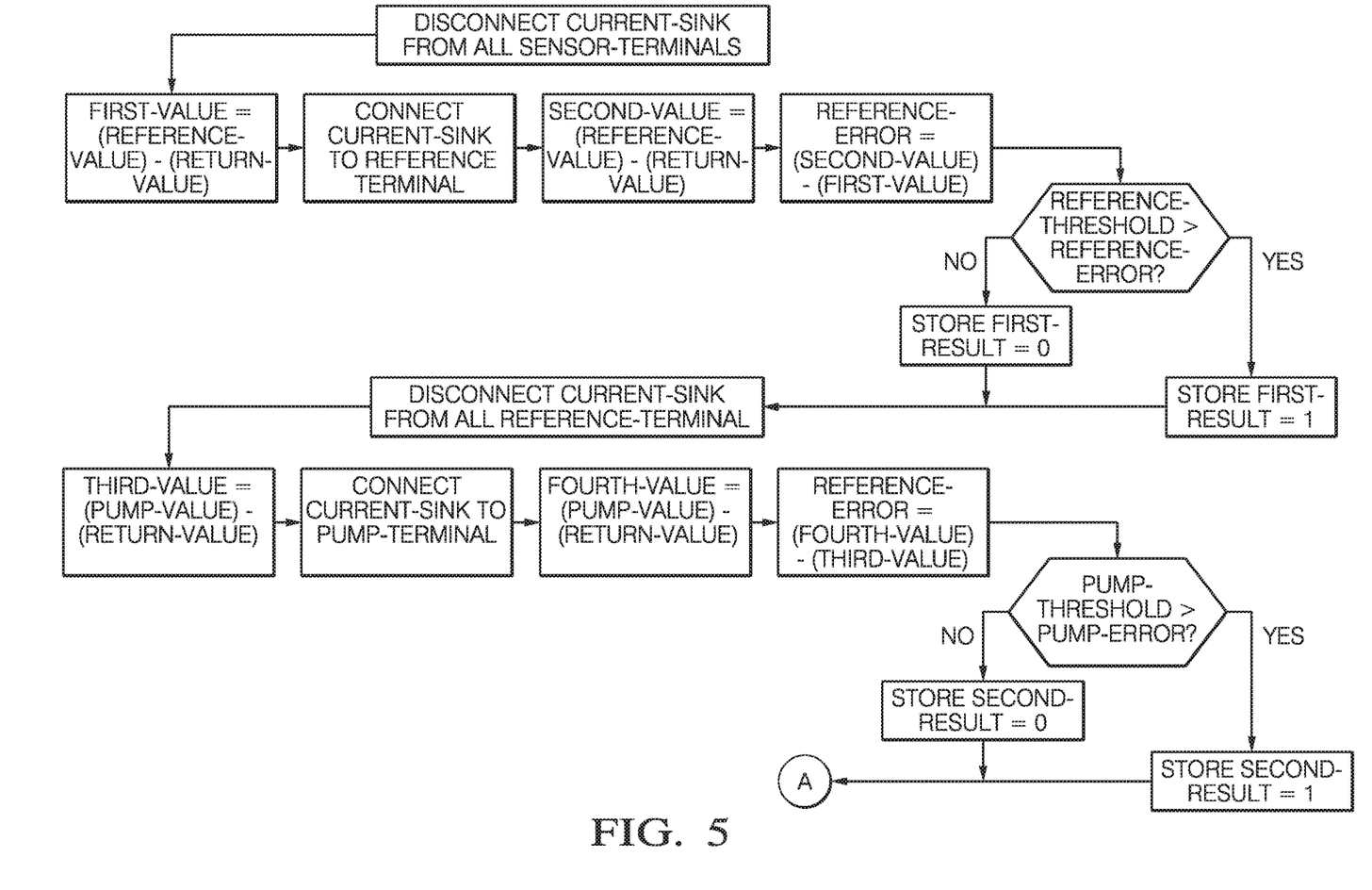
FIG. 5 is a flow chart illustrating a logic used by the controller in accordance with the invention.

FIG. 5 illustrates a flow-chart of a logic used by the controller 26 to determine the various status-values 28 and the sensor-status 30 as described above.

Figure 6:
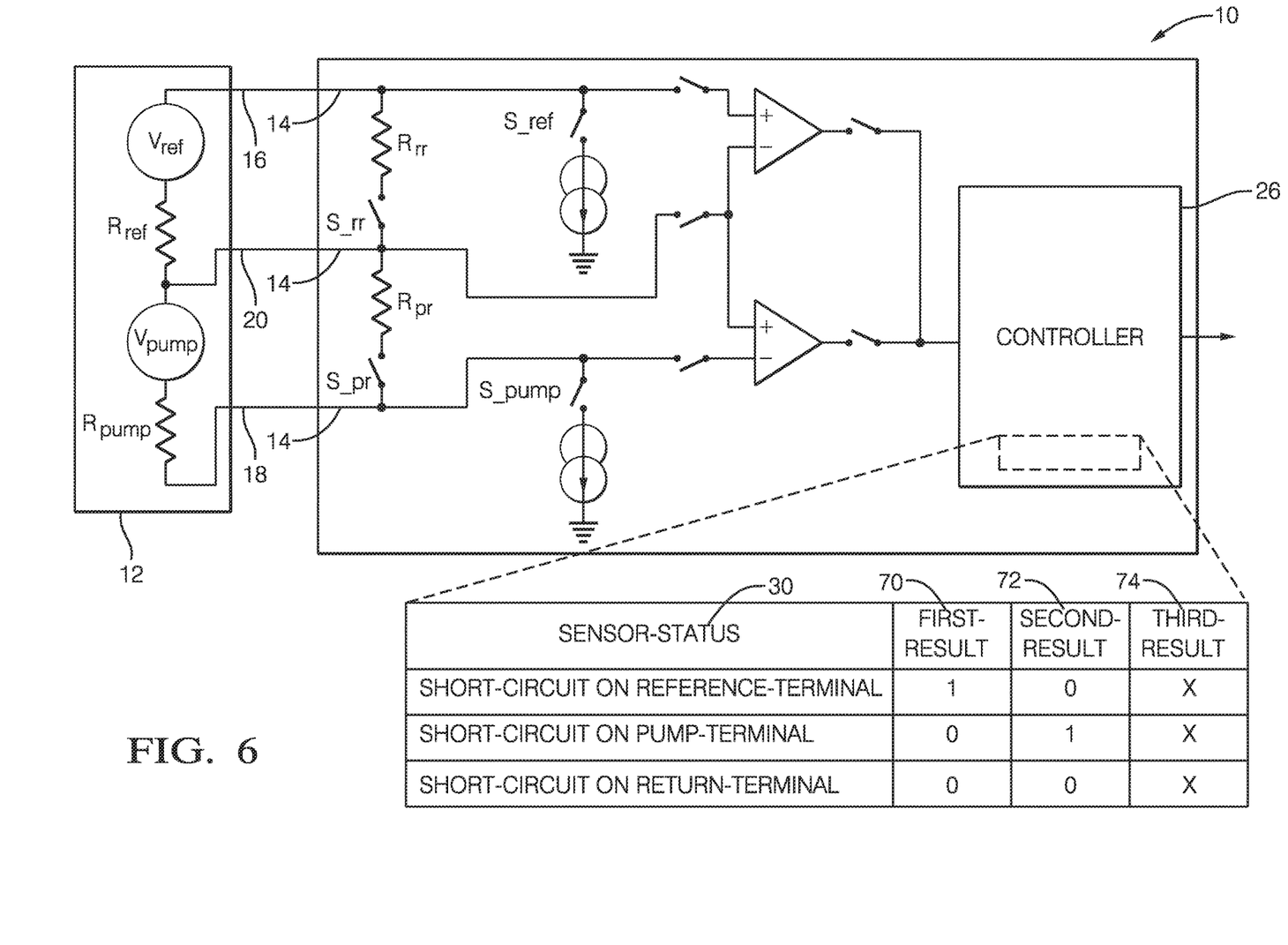
FIG. 6 is an illustration of a short-circuit pinpointing device in accordance with a third embodiment.

FIG. 6 illustrates a non-limiting example of a third embodiment of the device 10 that is designed to test another WRAF-sensor 12 to detect various short-to-ground and short-to-battery conditions. The device 10 includes input-channels 14 for connecting to the WRAF-sensor 12 at a reference-terminal 16, a pump-terminal 18, and a return-terminal 20. The table shown at the bottom of the drawing may be performed by software or other logic inside the controller 26.

Figure 7:
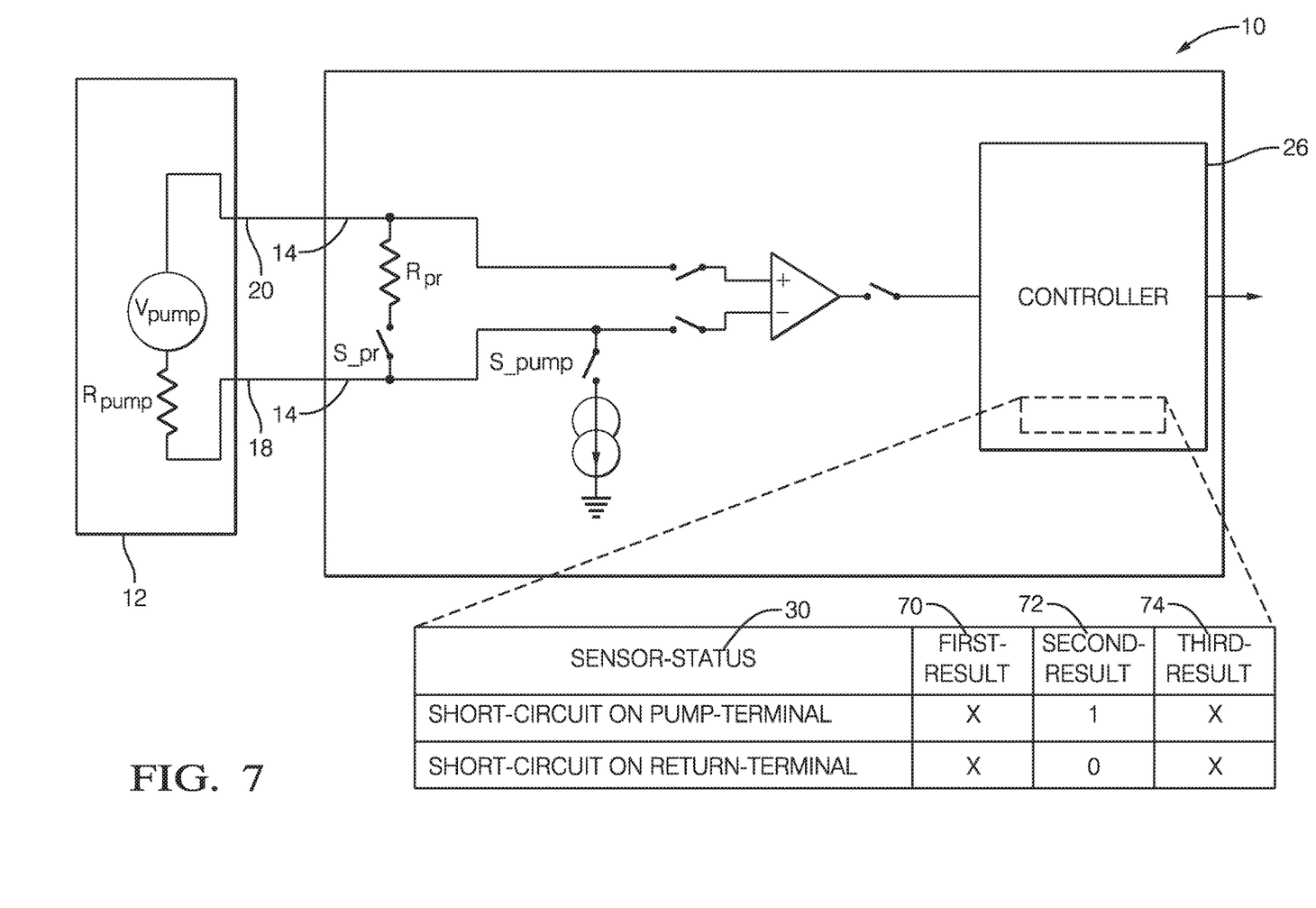
FIG. 7 is an illustration of a short-circuit pinpointing device in accordance with a fourth embodiment.

FIG. 7 illustrates a non-limiting example of a fourth embodiment of the device 10 that is designed to test yet another WRAF-sensor 12 to detect various short-to-ground and short-to-battery conditions. The device 10 includes input-channels 14 for connecting to the WRAF-sensor 12 at a pump-terminal 18 and a return-terminal 20. The table shown at the bottom of the drawing may be performed by software or other logic inside the controller 26.

Accordingly, a short-circuit pinpointing device 10, and a controller 26 for the short-circuit pinpointing device 10 is provided. The device 10 enables the reliable and accurate determination of the location of the short-circuit at any sensor-terminal using one electronic circuit over all the sensors' operating temperatures. The circuit is immune to any absolute circuit imperfection and non-idealities. Further, any component mismatches and all other errors at the input sensing stage are cancelled and do not affect the integrity of the pinpointing function.

While this invention has been described in terms of the preferred embodiments thereof, it is not intended to be so limited, but rather only to the extent set forth in the claims that follow. Moreover, the use of the terms first, second, upper, lower, etc. does not denote any order of importance, location, or orientation, but rather the terms first, second, etc. are used to distinguish one element from another. Furthermore, the use of the terms a, an, etc. do not denote a limitation of quantity, but rather denote the presence of at least one of the referenced items.

We claim:

1. A method for pinpointing a short-circuit in a wide-range air/fuel sensor having one or more sensor-terminals, the one or more sensor-terminals being one or more of a reference-terminal, a pump-terminal, a return-terminal, and a tag-terminal, said method comprising:
controlling a connection of a source of electric current to the one or more sensor-terminals;
determining one or more status-values based on signals present at the sensor-terminals;
determining a sensor-status of the wide-range air/fuel sensor based on the connection of source of electric current and the one or more status-values;
determining a first-value based on a difference between signals at the reference-terminal and the return-terminal while the source of electric current is disconnected;
determining a second-value based on the difference between signals at the reference-terminal and the return-terminal while the source of electric current is connected to the reference-terminal;
determining a reference-error based on the difference between the second-value and the first-value; and
determining that a short-circuit is present on the reference-terminal when a reference-threshold is greater than the reference-error.

2. The method in accordance with claim 1 further comprising controlling the connection of three test-resistors that are each selectively connectable between two of the sensor-terminals.

3. The method in accordance with claim 2, wherein the three test-resistors include a first-test-resistor, a second-test-resistor, and a third-test-resistor, the method further comprising:
controlling the connection of a first-test-resistor between the reference-terminal and the return-terminal;
controlling the connection of a second-test-resistor between the return-terminal and the pump-terminal; and
controlling the connection of a third-test-resistor is selectively connected between the pump-terminal and the tag-terminal.

4. A method for pinpointing a short-circuit in a wide-range air/fuel sensor having one or more sensor-terminals, the one or more sensor-terminals being one or more of a reference-terminal, a pump-terminal, a return-terminal, and a tag-terminal, said method comprising:
controlling a connection of a source of electric current to the one or more sensor-terminals;
determining one or more status-values based on signals present at the sensor-terminals;
determining a sensor-status of the wide-range air/fuel sensor based on the connection of source of electric current and the one or more status-values;
determining a third-value based on a difference between signals at the pump-terminal and the return-terminal while the source of electric current is disconnected
determining a fourth-value based on the difference between signals at the pump-terminal and the return-terminal while the source of electric current is connected to the pump-terminal;
determining a pump-error based on the difference between the fourth-value and the third-value; and
determining that a short-circuit is present on the pump-terminal when a pump-threshold is greater than the pump-error.

5. The method in accordance with claim 4 further comprising controlling the connection of three test-resistors that are each selectively connectable between two of the sensor-terminals.

6. The method in accordance with claim 5, wherein:
the three test-resistors include a first-test-resistor, a second-test-resistor, and a third-test-resistor;
the first-test-resistor is not connected between the reference-terminal and the return-terminal;
the second-test-resistor is connected between the return-terminal and the pump-terminal; and
the third-test-resistor is connected between the pump-terminal and the tag-terminal.

7. A method for pinpointing a short-circuit in a wide-range air/fuel sensor having one or more sensor-terminals, the one or more sensor-terminals being one or more of a reference-terminal, a pump-terminal, a return-terminal, and a tag-terminal, said method comprising:
controlling a connection of a source of electric current to the one or more sensor-terminals;
determining one or more status-values based on signals present at the sensor-terminals;
determining a sensor-status of the wide-range air/fuel sensor based on the connection of source of electric current and the one or more status-values;
determining a fifth-value based on a difference between signals at the tag-terminal and the pump-terminal while the source of electric current is disconnected;
determining a sixth-value based on the difference between signals at the tag-terminal and the pump-terminal while the source of electric current is connected to the tag-terminal;
determining a tag-error based on the difference between the sixth-value and the fifth-value; and
determining that a short-circuit is present on the tag-terminal when a tag-threshold is greater than the tag-error.

8. The method in accordance with claim 7 further comprising controlling the connection of three test-resistors that are each selectively connectable between two of the sensor-terminals.

9. The method in accordance with claim 8, wherein:
the three test-resistors include a first-test-resistor, a second-test-resistor, and a third-test-resistor;
the first-test-resistor is not connected between the reference-terminal and the return-terminal;
the second-test-resistor is connected between the return-terminal and the pump-terminal; and
the third-test-resistor is connected between the pump-terminal and the tag-terminal.

10. A method for pinpointing a short-circuit in a wide-range air/fuel sensor having one or more sensor-terminals, the one or more sensor-terminals being one or more of a reference-terminal, a pump-terminal, a return-terminal, and a tag-terminal, said method comprising:

controlling a connection of a source of electric current to the one or more sensor-terminals;

determining one or more status-values based on signals present at the sensor-terminals;

determining a sensor-status of the wide-range air/fuel sensor based on the connection of source of electric current and the one or more status-values;

determining a first-value based on a difference between signals at the reference-terminal and the return-terminal while the source of electric current is disconnected;

determining a second-value based on the difference between signals at the reference-terminal and the return-terminal while the source of electric current is connected to the reference-terminal;

determining a reference-error based on the difference between the second-value and the first-value;

determining that a short-circuit is present on the reference-terminal when a reference-threshold is greater than the reference-error;

determining a third-value based on the difference between signals at the pump-terminal and the return-terminal while the source of electric current is disconnected;

determining a fourth-value based on the difference between signals at the pump-terminal and the return-terminal while the source of electric current is connected to the pump-terminal;

determining a pump-error based on the difference between the fourth-value and the third-value;

determining that the short-circuit is present on the pump-terminal when a pump-threshold is greater than the pump-error;

determining a fifth-value based on the difference between signals at the tag-terminal and the pump-terminal while the source of electric current is disconnected;

determining a sixth-value based on the difference between signals at the tag-terminal and the pump-terminal while the source of electric current is connected to the tag-terminal;

determining a tag-error based on the difference between the sixth-value and the fifth-value;

determining that the short-circuit is present on the tag-terminal when a tag-threshold is greater than the tag-error; and determining that the short-circuit is present on the return-terminal when the reference-error is greater than the reference-threshold and when the pump-error is greater than the pump-threshold and when the tag-error is greater than the tag-threshold.

11. The method in accordance with claim 10 further comprising controlling the connection of three test-resistors that are each selectively connectable between two of the sensor-terminals.

12. The method in accordance with claim 11, wherein:

the three test-resistors include a first-test-resistor, a second-test-resistor, and a third-test-resistor;

the first-test-resistor is connected between the reference-terminal and the return-terminal, the second-test-resistor is connected between the return-terminal and the pump-terminal, and the third-test-resistor is connected between the pump-terminal and the tag-terminal when the first-value and the second-value are determined; and the first-test-resistor is not connected between the reference-terminal and the return-terminal, the second-test-resistor is connected between the return-terminal and the pump-terminal, and the third-test-resistor is connected between the pump-terminal and the tag-terminal when the third-value, the fourth-value, the fifth-value and the sixth-value are determined.

\* \* \* \* \*